(12) United States Patent
Yan et al.

(10) Patent No.: US 8,598,151 B2
(45) Date of Patent: Dec. 3, 2013

(54) SOLID SOLUTION INDUCING LAYER FOR WEAK EPITAXY GROWTH OF NON-PLANAR PHTHALOCYANINE

(75) Inventors: Donghang Yan, Shanghai (CN); Yanhou Geng, Shanghai (CN); Hongkun Tian, Shanghai (CN); Lizhen Huang, Shanghai (CN); Jianfeng Shen, Shanghai (CN); Xiaodong Guo, Shanghai (CN)

(73) Assignee: Shanghai Casail Display Technology Ltd., Shanghai (CN)

( * ) Notice: Subject to any disclaimer, the term of this patent is extended or adjusted under 35 U.S.C. 154(b) by 154 days.

(21) Appl. No.: 13/187,217

(22) Filed: Jul. 20, 2011

(65) Prior Publication Data

US 2012/0153265 A1   Jun. 21, 2012

(30) Foreign Application Priority Data

Dec. 21, 2010   (CN) .......................... 2010 1 0605569

(51) Int. Cl.
*A61K 31/33* (2006.01)
*C09B 47/04* (2006.01)

(52) U.S. Cl.
USPC .......................................... 514/183; 540/122

(58) Field of Classification Search
USPC .......................................... 514/183; 540/122
See application file for complete search history.

(56) References Cited

FOREIGN PATENT DOCUMENTS

CN   200910200459.5 A   12/2009

OTHER PUBLICATIONS

England et al., ACS Symposium Series, (1994) 561, Interfacial Design and Chem. Sensing), pp. 202-215.*
Vogel, J.O. et al, "Sub-nanometer Control of the Interlayer Spacing in Thin Films of Intercalated Rodlike Conjugated Molecules," J. Phys. Chem. B, 2007, vol. 111, pp. 14097-14101.
Wang, H. et al., "High mobility vanadyl-phthalocyanine polycrystalline films for organic field-effect transistors," Applied Physics Letters, 2007, vol. 90, pp. 253510-1-253510-3.
Wang, H. et al., "Weak Epitaxy Growth Affording High-Mobility Thin Films of Disk-Like Organic Semiconductors," Advanced Materials, 2007, vol. 19, pp. 2168-2171.

* cited by examiner

*Primary Examiner* — Taofiq A Solola
(74) *Attorney, Agent, or Firm* — Birch, Stewart, Kolasch & Birch, LLP

(57) ABSTRACT

The present invention relates to solid solution inducing layer for the preparation of weak epitaxial films of non-planar phthalocyanine and the thin film of non-planar phthalocyanine generated from the weak epitaxial growth on the solid solution inducing layer and organic thin film transistor based on the weak rpitaxy growth thin film of non-planar phthalocyanine. The solid solution inducing layer is prepared at certain substrate temperature by vapor co-deposition of any two inducing layer molecules presented by Formula I and Formula II.

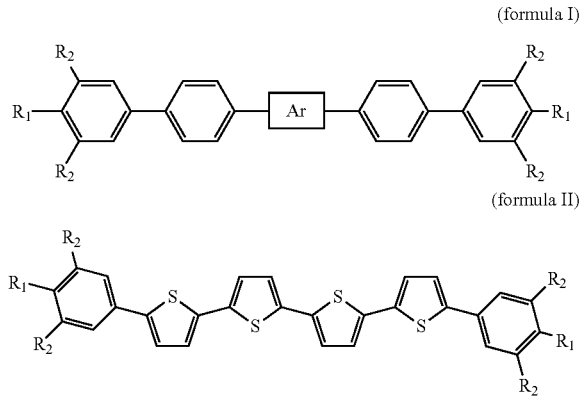

The solid solution inducing layer has uniformed structure, of which the lattice parameter and electronic structure can be controlled by adjusting the component proportion, the solid solution inducing layer can epitaxially grow a high quality thin film of non-planar phthalocyanine and fabricate high performance transistor device based on such epitaxial thin film.

7 Claims, 16 Drawing Sheets

SOLID SOLUTION INDUCING LAYER FOR WEAK EPITAXY GROWTH OF NON-PLANAR PHTHALOCYANINE

TECHNICAL FIELD

The present invention relates to a series of solid solution inducing layer for the preparation of weak epitaxial films of non-planar phthalocyanine and the electronic devices based on such epitaxial films.

BACKGROUND TECHNOLOGY

Organic semiconductor, with the characteristics of light weight, easy processing, flexibility, shows broad application prospects in display, integrated circuit, photovoltaic cells and sensors. In recent years, with the rapid development of organic electronics, requirement for semiconductor materials and films of high carrier mobility is more and more obvious. Wang Haibo et al. (Adv. Mater., 2007, 19, 2168-2171) first reported a method named Weak Epitaxy Growth to prepare crystalline thin films of organic semiconductor, and the carrier mobility of the resulting crystalline thin films reaches the level of the corresponding single crystal. Weak Epitaxy Growth refers to the method in which a crystalline organic inducing layer with insulating property is employed as substrate to induce growth of the crystalline thin films of organic semiconductors. An epitaxy relationship exists between the lattice of organic semiconductors and the inducing layer, which can realize the oriented growth of organic semiconductors; meanwhile, there is relatively weak VDW(Van der Waals' force) between the inducing layer molecule and the organic semiconductor molecule, thus the semiconductor molecule "stands" on the inducing layer surface, which makes the charge transport direction of the organic semiconductor prefer in the thin film plane. The weak epitaxial grown organic semiconductor thin films present single-crystal-like electrical conductivity. Non-planar phthalocyanine is a kind of material with high mobility, whose crystal packing is usually 2D π-π stacking. Haibo Wang et al. (Appl. Phys. Lett., 2007, 90, 253510) used the p-6P as inducing layer to epitaxially grow VOPc, result in a field effect mobility of 1.5 $cm^2/Vs$ for the epitaxial VOPc films. However, the Weak Epitaxy Growth of VOPc thin film shows incommensurate epitaxy on the p-6P inducing layer, which results from the lattice mismatch between the p-6P and VOPc. There are significant differences in parameter and type of the unit cell between non-planar metal phthalocyanine and planar metal phthalocyanine, thus the requirement on the unit cell of inducing layer is also different. The Chinese patent ("Inducing Layer Materials for Weak Epitaxial Films of Non-planar Metal Phthalocyanine", application No.: 200910200459.5) provides a series of new inducing layer materials by changing rod-like molecular structure with chemosynthesis method. It requires a great amount of screening work to match organic semiconductor materials through selecting such single inducing layer materials with different lattice parameters, and meanwhile it is difficult to fine-tune lattice parameters. Norbert Koch et al. (J. Phys. Chem. B, 2007, 111, 14097-14101) points out that lattice parameter of mixed films of organic semiconductor molecules varies with the proportion of the mixing. It is convenient to change the lattice parameter by using such physical co-deposition method to form solid solution film. The present invention prepares solid solution thin film with a homogeneous structure by using a physical method of co-deposition, which act as inducing layer to weak epitaxy growth of non-planar phthalocyanine. At certain substrate temperature, the solid solution inducing layer is formed by co-deposition. It is homogeneous without any phase segregation, and each domain shows single crystal structure, and adjacent domains closely coalesce forming continuous smooth films, of which the lattice parameter varies continuously with the changes of component proportion, the electronic structure of the mixed films acts the same.

CONTENT OF THE INVENTION

In order to overcome the deficiencies of the previous technology, one purpose of the present invention is to provide a kind of solid solution inducing layer, which is prepared with either of two inducing layer molecules of the following general formula I and II by means of co-deposition method at certain substrate temperature:

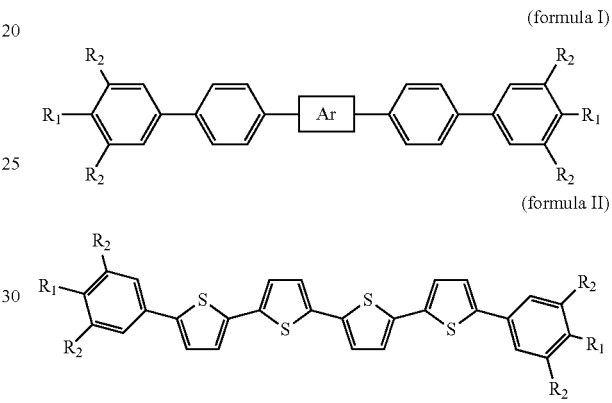

Another purpose of the present invention is to provide a kind of thin films of non-planar phthalocyanine formed from the weak epitaxial growth on aforesaid solid solution inducing layer.

The other purpose of the present invention is to provide a kind of organic thin film transistor which is made of the above weak epitaxial growth non-planar phthalocyanine as organic semiconductor layer.

The principle of the present invention is to prepare solid solution inducing layer by vapor co-deposition method. Co-deposition of two single inducing layer molecules forms homogeneous and large grain-sized solid solution thin film with single-crystal-like structure at certain substrate temperature. The lattice parameter of the solid solution thin film is controlled by component proportion; meanwhile, the electronic structure of the solid solution thin film of is different from that of each single component.

One of the advantage of the present invention is the lattice parameter of inducing layer thin film can be controlled by component proportion so that the lattice match between the inducing layer and the non-planar phthalocyanine can be controlled to be suitable, which is helpful to generate high-quality thin films of non-planar phthalocyanine.

In another respect, the electronic structure of the solid solution inducing layer can be controlled by component proportion. Since there is usually a heterojunction effect between inducing layer and non-planar phthalocyanine, and the change of electronic structure leads to the change of the heterojunction effect between non-planar metal phthalocyanine and the inducing layer, which is helpful to adjust the performance of non-planar phthalocyanine transistor device.

The molecules in the present invention used to compose the solid solution inducing layer thin film provided by Chinese patent ("Inducing Layer Materials for Weak Epitaxial Films of Non-planar Metal Phthalocyanine", application No.: 200910200459.5), which is shown as the following general formula:

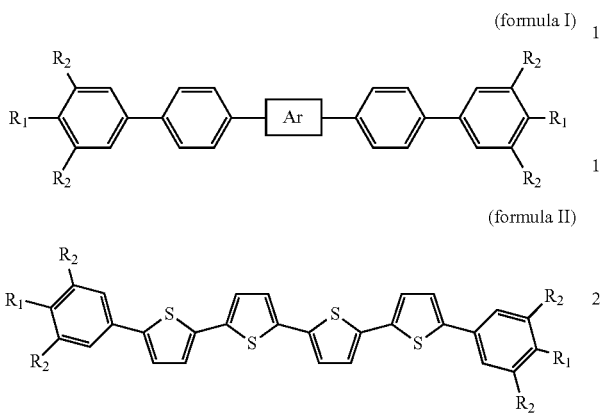

Ar in general formula I is a conjugated aromatic group, or one of the following structures:

n = 2(5), 3(6), 4(7)

R1 and R2 in general formula I and II are hydrogen atoms (H) or fluorine atoms (F).

When Ar in general formula I is a conjugated aromatic group, it includes the following structures:

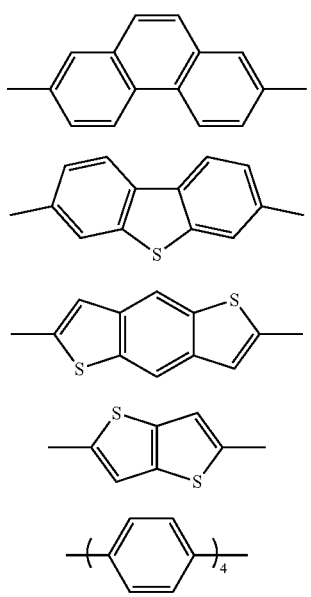

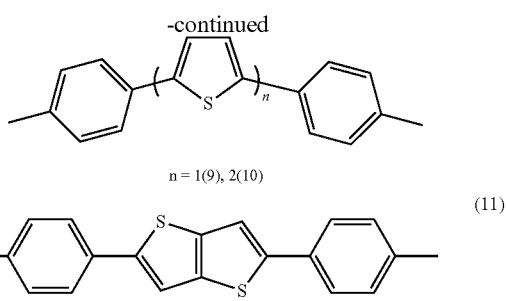

n = 1(9), 2(10)

The molecules in the inducing layer are:
2,7-bi(4-biphenylyl)-phenanthrene (BPPh), 2,7-bi(4-biphenylyl)-dibenzothiophene (BPBTB), 2,6-bi(4-biphenylyl)-benzo[1,2-β:4,5-β']bithiophene (BPTBT), 2,5-bi(4-biphenylyl)-[3,2-β]bidithiophene (BPTT), 5,5"-bi(biphenylyl)-2,2':5',2"-terthiophene (BP3 T), 5,5'''-bi (biphenylyl)-2,2':5',2":5",2'''-quaterthiophene (BP4T), 1,1':4',1''':4''',1''''':4''''',1''''''-octiphenyl (p8P), 2,5-bi(4-1,1':4',1"-terbiphenylyl)-thiofuran (3PT), 5,5'-bi (4-1,1':4',1"-terbiphenylyl)-2,2'-bithiophene (3P2T), 2,5-bi(4-1, 1':4',1"-terbiphenylyl)-[3,2-β]bithiophene (3PTT), 2,7-bi(4-4'-fluorobiphenylyl)-phenanthrene (F2-BPPh), 2,7-bi(4-4'-fluorobiphenylyl)-dibenzothiophene (F2-BPBTB), 2,6-bi(4-4'-fluorobiphenylyl)-benzo[1,2-β:4,5-β'] bithiophene (F2-BPTBT), 2,5-bi(4-4'-fluorobiphenylyl)-[3, 2-b]bidithiophene (F2-BPTT), 5,5'-bi(4-4'-fluorobiphenylyl)-2,2'-bithiophene (F2-BP2T), 5,5"-bi(4-4'-fluoro biphenylyl)-2,2':5',2"-terthiophene (F2-BP3T), 5,5'''-bi(4-4'-fluorobiphenylyl)-2,2':5',2":5",2'''-quaterthiophene (F2-BP4T), 4,4''''''-bi(4-fluorophenyl)-1,1':4',1''':4''',1''''':4''''', 1''''':4''''',1'''''''-sexiphenyl(F2-p8P), 2,5-bi(4-4"-fluoro-1,1':4', 1"-terbiphenylyl)-thiofuran (F2-3PT), 5,5'-bi(4-4"-fluoro-1, 1':4',1"-terbiphenylyl)-2,2'-bithiophene (F2-3P2T), 2,5-bi(4-4"-fluoro-1,1':4',1"-terbiphenylyl)-[3,2-β]bidithiophene (F2-3PTT), 2,7-bi(4-3',5'-bifluorobiphenylyl)-phenanthrene (F4-BPPh), 2,7-bi(4-3',5'-bifluorobiphenylyl)-dibenzothiophene (F4-BPBTB), 2,6-bi(4-3',5'-bifluorobiphenylyl)-benzo[1,2-β:4,5-β']bithiophene (F4-BPTBT), 2,5-bi(4-3',5'-bifluorobiphenylyl)-[3,2-β]bidithiophene (F4-BPTT), 5,5'-bi(4-3',5'-bifluorobiphenylyl)-2,2-bithiophene (F4-BP2T), 5,5"-bi(4-3',5'-bifluorobiphenylyl)-2,2':5',2"-terthiophene (F4-BP3T), 5,5'''-bi(4-3',5'-bifluorobiphenylyl)-2,2':5',2":5",2'''-quaterthiophene (F4-BP4T), 4,4''''''-bi(3,5-bifluorophenyl)-1,1':4', 1''':4''',1''''':4''''',1'''''''-octiphenyl (F4-p8P), 2,5-bi(4-3", 5"-difluoro-1,1':4',1"-terphenylyl)-thiofuran (F4-3PT), 5,5'-bi(4-3",5"-difluoro-1,1':4',1"-terphenyl yl)-2,2'-bithiophene (F4-3P2T), 2,5-bi(4-3",5"-difluoro-1,1':4',1"-terphenylyl)-[3,2-β]bidithiophene (F4-3PTT), 5,5'''-diphenyl-2,2':5',2": 5",2'''-tetrathiophene (P4T), 5,5'''-bi(4-fluorophenyl)-2,2':5', 2":5",2'''-tetrathiophene (F2-P4T) and 5,5'''-bi(3,5-bifluorophenyl)-2,2':5',2":5",2'''-tetrathiophene (F 4-P4T)

It is divided into following types according to the choice of the material composed the solid solution inducing layers:

Type 1, phenyl is used as terminal group in the two molecules of the inducing layer, i.e. R1, R2 is fixed to be hydrogen atom with the changing of mid conjugated aromatic group. For example, BPPh:BPTT, BPPh:BP2T, BPPh: 6P, BPPh:BPBTB, BPPh:BPBTB, BPPh:BP3T, BPTT:BPTBT, BPTT: 3PT, BP3T: 3PT, p6P:p8P, BP3T: BP4T, BPTBT: 3PTT, 3PTT:p8P.

Type 2, phenyl is used as terminal group in one inducing layer, and phenyl containing F atoms as terminal group in the other one, i.e. R1 or R2 is fluorine atom, wherein the mid conjugated aromatic group can be same or different. For example, P4T:F2-P4T, P4T:F4-P4T, BP3T:F2-BP3T, BP3T: F4-BP3T BPPh:F2-BPPh, BPPh:F4-BPPh, BPTT:F2-BPTT, BPTT:F4-BPTT, BP4T:F2-BP4T, BP4T:F4-BP4T, BPTBT: F2-BPTBT, BPTBT:F4-BPTBT, p8P:F2-p8P, 3PT:F2-3PT, 3P2T:F2-3P2T, 3PTT:F2-3PTT, BPTT:F2-BPPh, BPPh:F2-BPTT.

Type 3, phenyl containing F atoms as terminal group in the two molecules which forms the solid solution, wherein the mid conjugated aromatic group can be same or different. For example, F2-BPPh:F4-BPPh, F2-BPTT:F4-BPTT, F2-BP3T: F4-BP3T, F2-BPTBT:F4-BPTBT, F2-3PT:F4-3PT, F2-3PTT:F4-3PTT, F2BP3T:F2BP4T, F2-BPPh:F2-BPTT, F2-BPBTB:F2:BPTBT.

The molecules used to prepare the solid solution inducing layer can be any two kinds of or the combination of aforesaid molecules of this invention.

Two inducing layer molecules used in the solid solution inducing layer can be co-deposition at any proportion of this invention.

Co-deposition in this invention is to evaporate two sample sources at the same time during the vapor deposition, which makes two kinds of molecule deposit onto the substrate at the same time, and the component proportion of thin film was controlled by adjusting the evaporation rate of the two sample sources.

DETAILED DESCRIPTION OF THE INVENTION

Figure 1A:
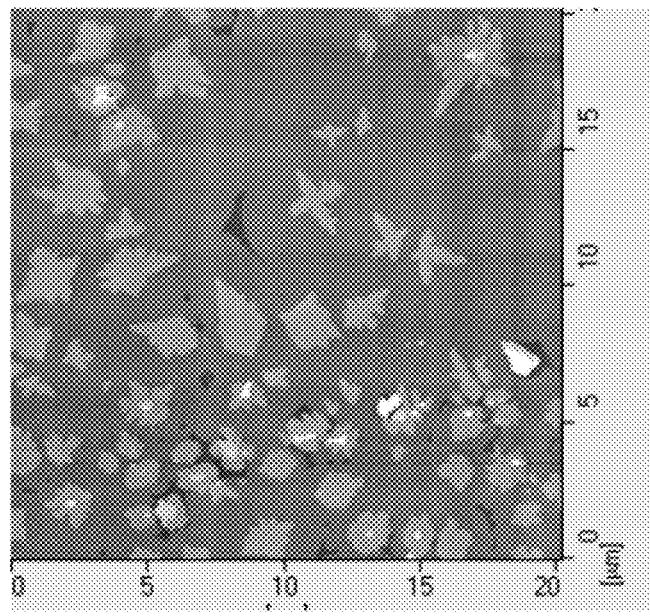
FIG. 1a is anatomic force microscopy (AFM) topographic image of 2.5 nm BPTT:BPPh solid solution inducing layer film with component proportion of 2:1.

The present invention is further described by combination with the example below.

Example 1

The glass substrate used in the experiment is commercial product Corning 7059 (6), which is bought from US corning company and used after cleaned. The non-planar phthalocyanine used in the experiment is commercial product, which is bought from US Aldrich Company and used after purified by sublimation. The inducing layer material used in the experiment is used after purified by sublimation.

First of all, an Al/Mo/Nd alloy film is plated by means of RF magnetron sputtering on Corning 7059 glass substrate(6), and the sputtering condition is: background vacuum being $2 \times 10^{-3}$ Pa, air pressure of Ar being 1 Pa, RF power being 500W, and photoetching into grid electrode(5), then using chemical vapor deposition method to generate 300 nm silicon nitride as the insulator layer (4). Then, 1-3 molecular layer of the solid solution inducing layer is deposited on the surface of silicon nitride(3). The detailed method is that put two kinds of molecules such as BPTT and BPPh into 2 sample sources, and evaporating the 2 source materials to deposit on the insulator layer(4) at the same time, the component proportion of thin film was controlled by adjusting the evaporating rate of the two sources. In the process of deposition, vacuum is $10^{-4}$ Pa, substrate temperature is 230° C. Then, 20 nm non-planar phthalocyanine is deposited on the inducing layer as organic semiconductor layer(2), pressure and substrate temperature are the same as those during the inducing layer preparation (3). Finally, vacuum thermal evaporation is used to deposit 60 nm Au to form a source/drain electrode (1), while the pressure is $10^{-4}$ Pa during the evaporation.

Figure 1B:
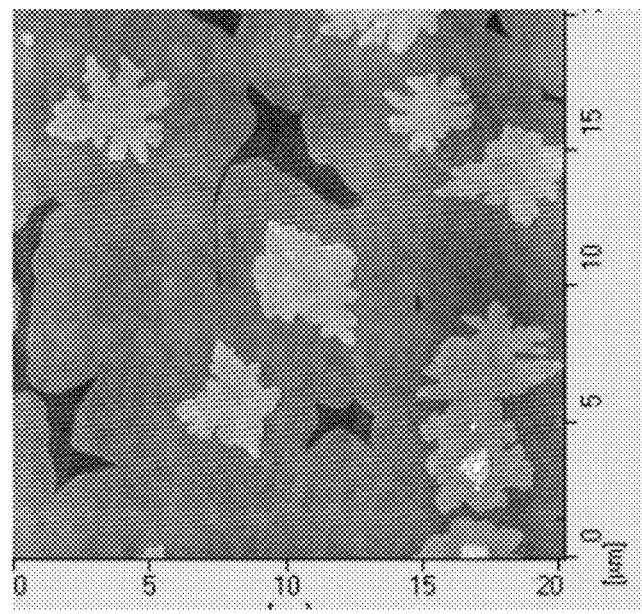
FIG. 1b is an AFM topographic image of 2.5 nm BPTT: BPPh solid solution inducing layer film with component proportion of 1:1.
Figure 1C:
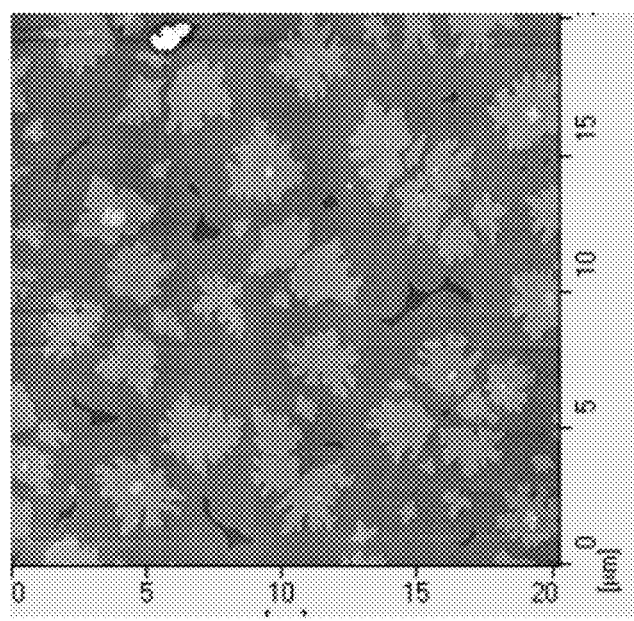
FIG. 1c is an AFM topographic image of 2.5 nm BPTT: BPPh solid solution inducing layer film with component proportion of 1:2.

FIG. 1 is AFM topographic image of 2.5 nm BPTT:BPPh solid solution inducing layer with different component proportion, of all the component proportion in the experiment the solid solution films present layer by layer growth, adjacent domains coalesced, forming a large grain-sized, continuous and smooth thin films which is benefit for the epitaxial growth of upper semiconductor layer.

Figure 2A:
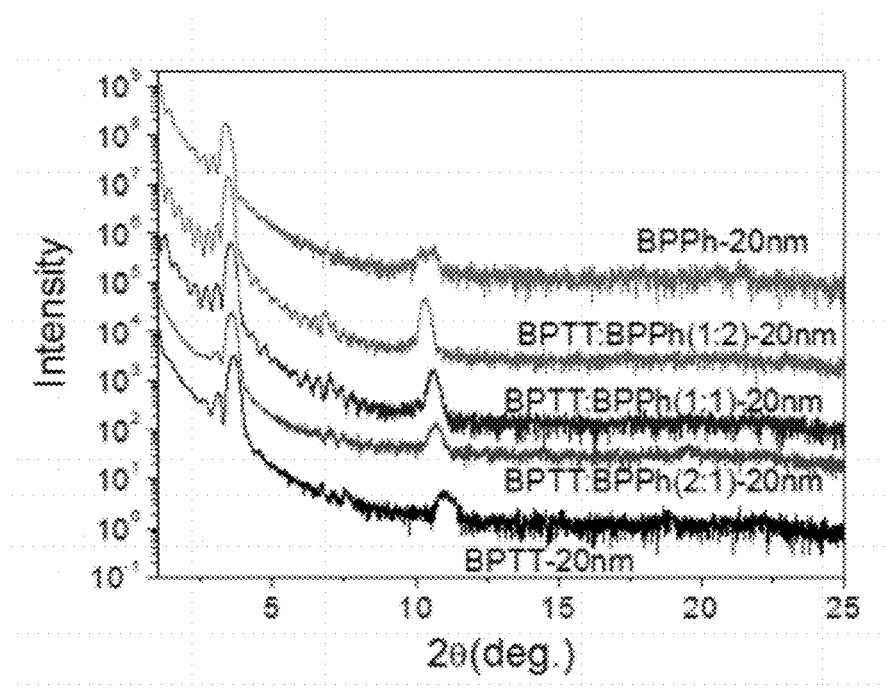
FIG. 2a is out-of-plane X-ray diffraction patterns of 20 nm BPTT:BPPh solid solution thin films with different component proportion.
Figure 2B:
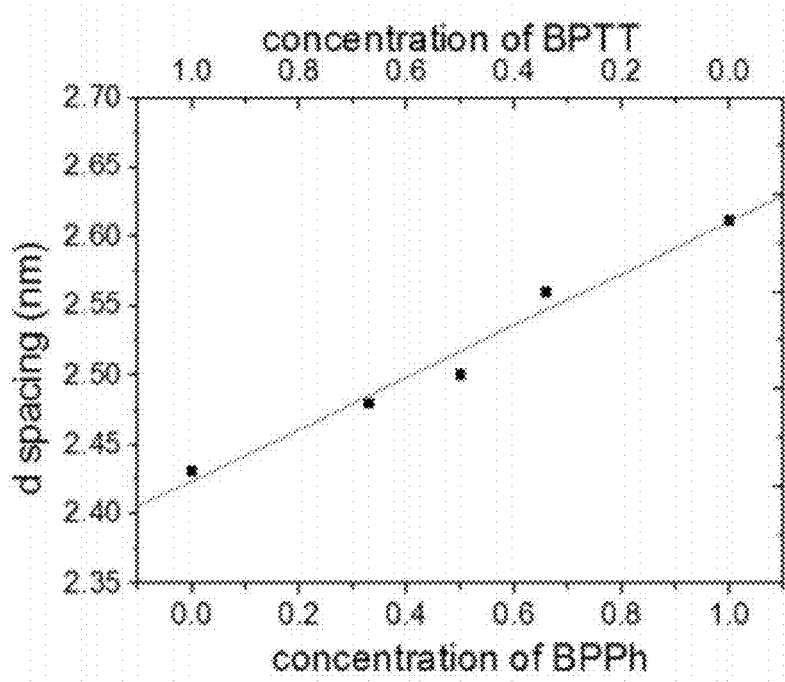
FIG. 2b is a graph correlate the lattice spacing of (001) with the component proportion of the BPTT:BPPh solid solution inducing layer.
Figure 3A:
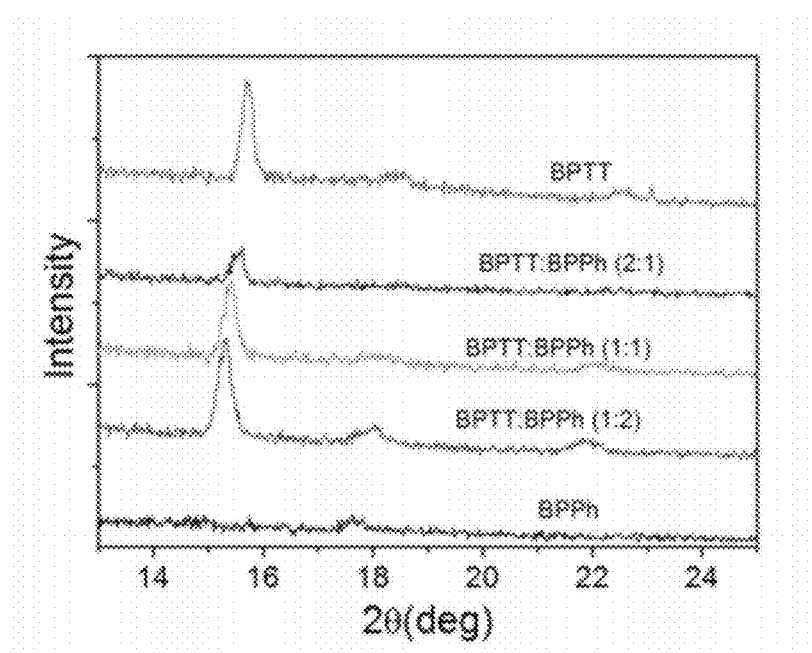
FIG. 3a is in-plane Grazing Incidence X-ray Diffraction (GIXD) patterns of 5 nm BPTT:BPPh solid solution inducing layer films with different proportion.
Figure 3B:
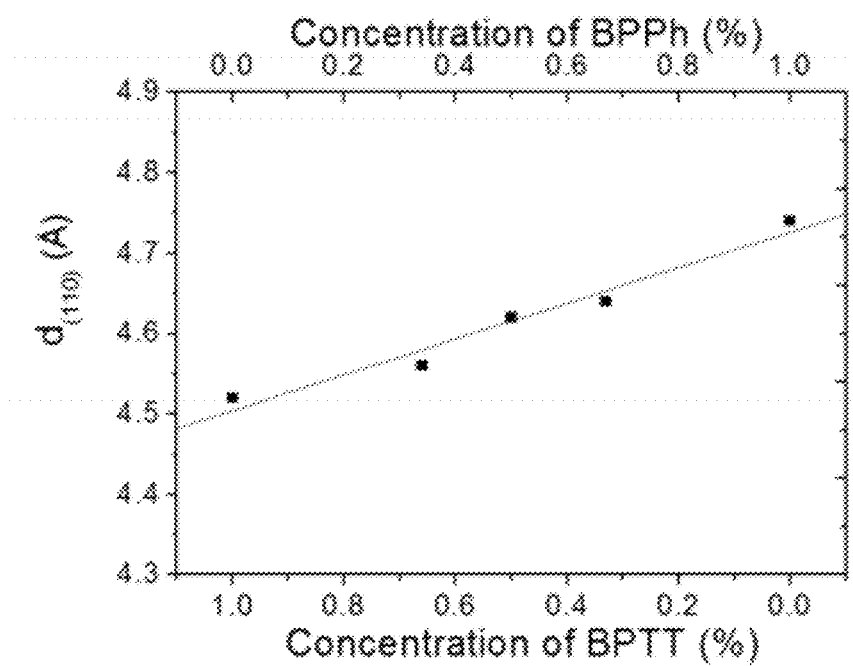
FIG. 3b is a graph correlate the lattice spacing of (110) with the component proportion of 5 nm BPTT:BPPh solid solution inducing layer films.
Figure 4A:
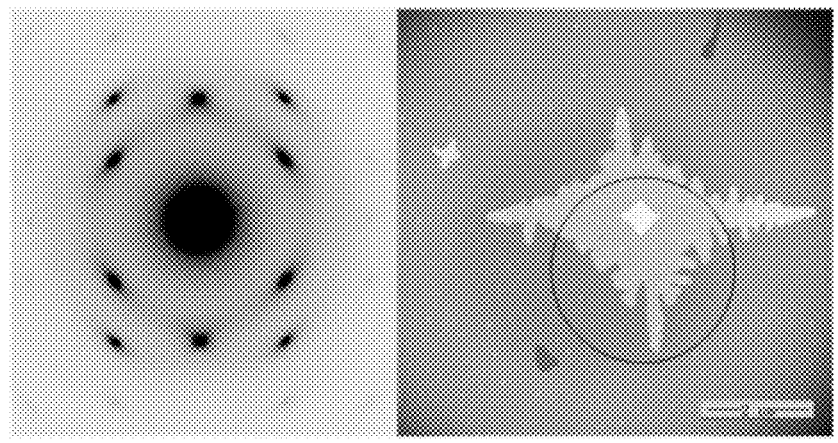
FIG. 4a is the Selected Area Electron Diffraction and its corresponding electron micrograph of 2.5 nm BPTT:BPPh solid solution inducing layer film with the component proportion of 1:2
Figure 4B:
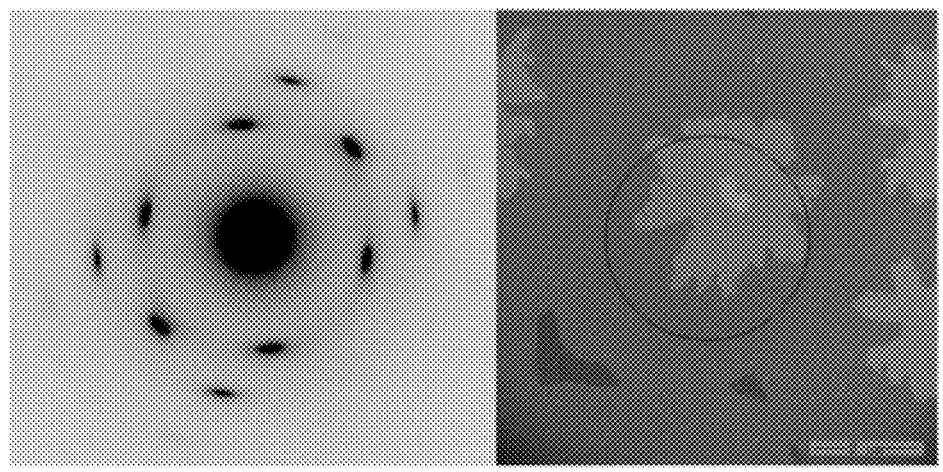
FIG. 4b is the Selected Area Electron Diffraction and its corresponding electron micrograph of 2.5 nm BPTT:BPPh solid solution inducing layer film with the component proportion of 2:1.

FIG. 2*a* is an out-of-plane X-ray diffraction patterns of 20 nm BPTT:BPPh films with different proportion. The patterns contain a series of (00l) diffraction, which means the thin film is highly ordered. Meanwhile, each diffraction peak shows a single peak, indicating the co-deposited thin films are of uniform composition with single-crystal-like structure, which is a solid solution thin film. FIG. 2*b* indicated the diffraction peak continuously changes with component proportion. FIG. 3 is in-plane X ray diffraction patterns of 20 nm BPTT:BPPh thin films of different proportion, all co-deposition films show a series diffraction peaks with single structure, and the thin film structure parameter thereof linearly varies with component proportion. FIGS. 4*a* and 4*b* are the selected area electron diffraction patterns of BPTT:BPPh (1:2) and (2:1) solid solution films, single domain shows diffraction pattern similar to that of single crystal, which further shows the co-deposition thin film is a solid solution film with a structure different from that of single component thin film.

Figure 5:
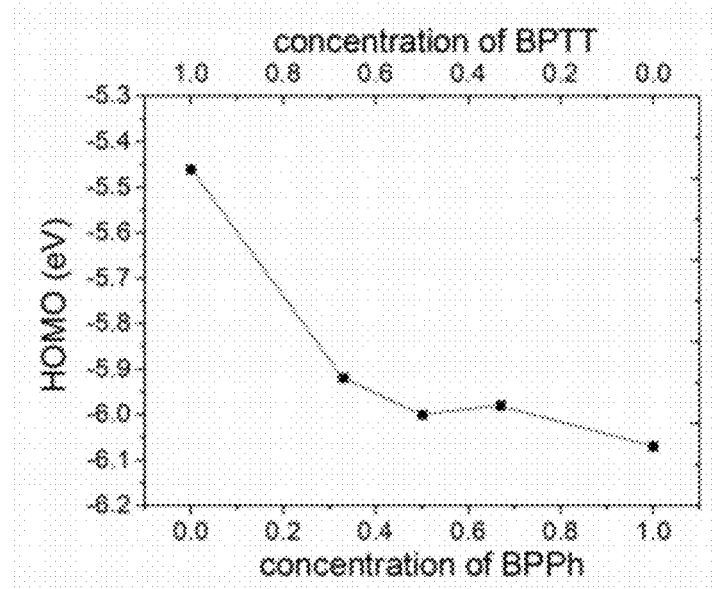
FIG. 5 is relation between HOMO energy level and component proportion of BPTT:BPPh solid solution inducing layer films

FIG. 5 is the HOMO energy level of solid solution films with different component proportion, the HOMO value is between that of the two single substance films and varies with component proportion.

Figure 6A:
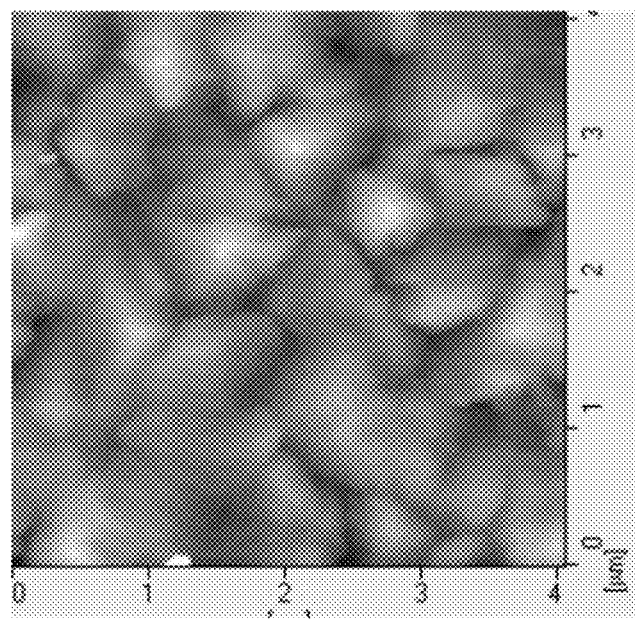
FIG. 6a is an AFM topographic image of 20 nm VOPc epitaxial grown on 2.5 nm BPTT:BPPh inducing layer with a component proportion of (2:1).
Figure 6B:
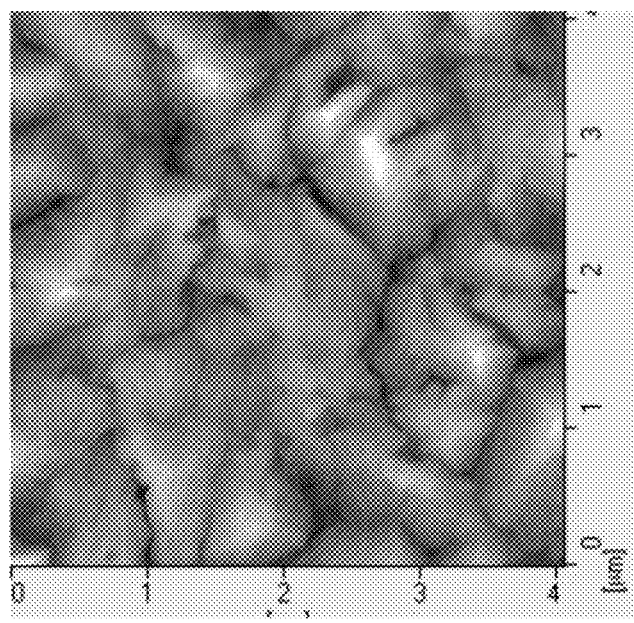
FIG. 6b is an AFM topographic image of 20 nm VOPc epitaxial grown on 2.5 nm BPTT:BPPh inducing layer with a component proportion of (1:1)
Figure 6C:
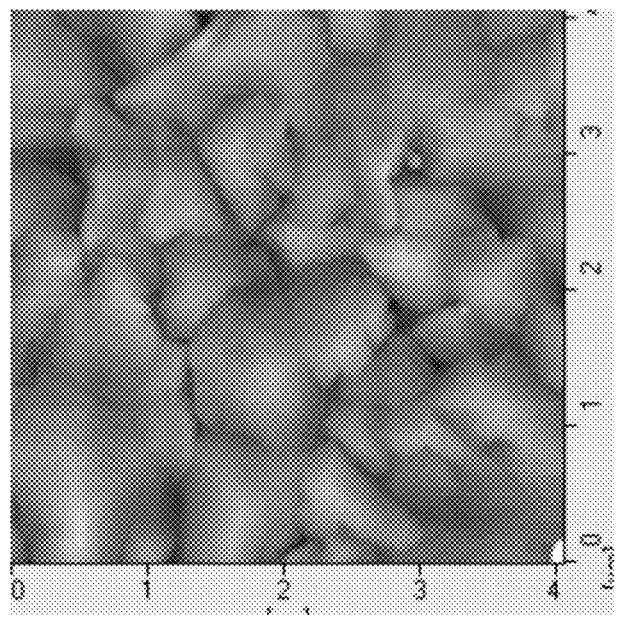
FIG. 6c is an AFM topographic image of 20 nm VOPc epitaxial grown on 2.5 nm BPTT:BPPh inducing layer with a component proportion of (1:2)
Figure 7A:
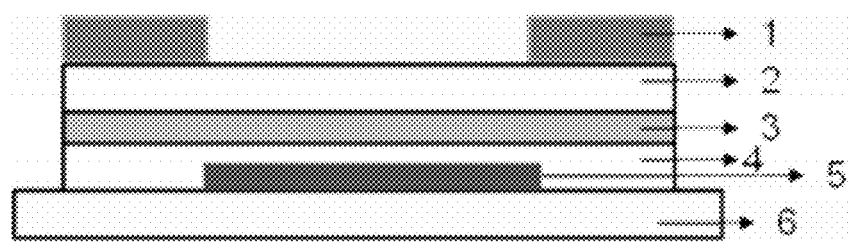
FIG. 7a is a transistor configuration based on the epitaxial grown non-planar phthalocyanine thin film using the solid solution film as the inducing layer, including: (1) source/drain electrode, (2) organic semiconductor layer, (3) solid solution inducing layer, (4) insulator, (5) gate electrode, (6) substrate.
Figure 7B:
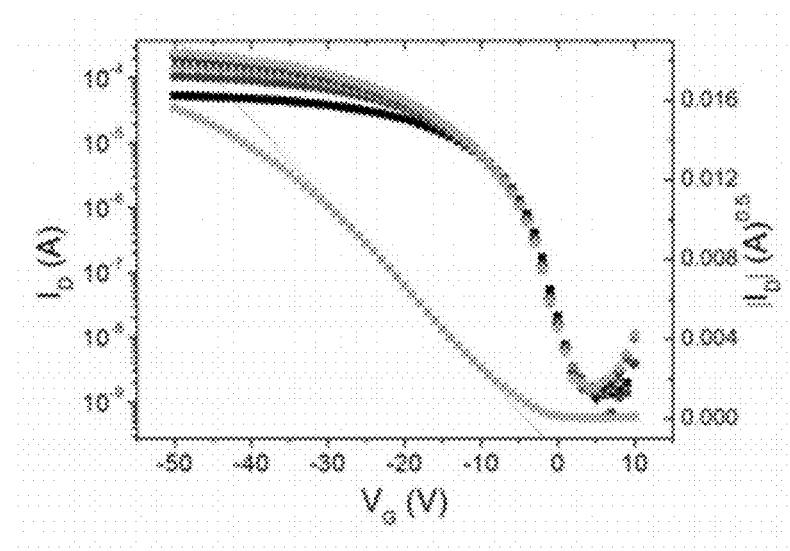
FIG. 7b is a transfer curve of the VOPc thin-film transistor epitaxy growth on 2.5 nm BPTT: BPPh inducing layer with a component proportion of (2:1)
Figure 7C:
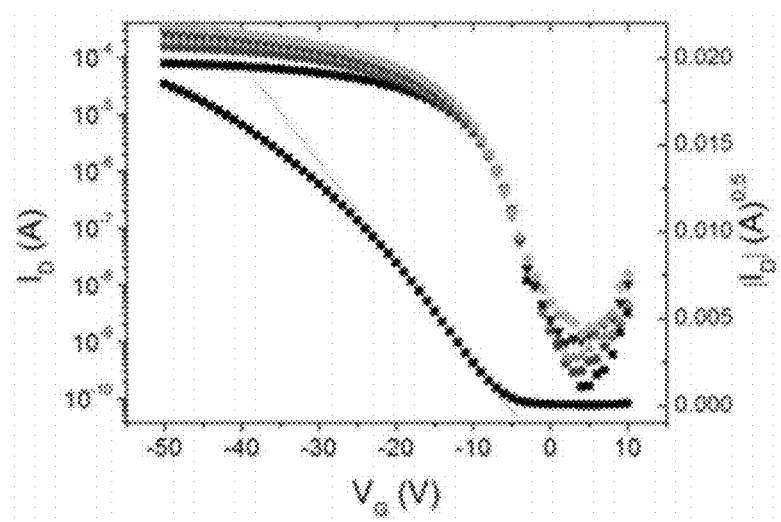
FIG. 7c is a transfer curve of the VOPc thin-film transistor epitaxy growth on 2.5 nm BPTT: BPPh inducing layer with a component proportion of (1:1)
Figure 7D:
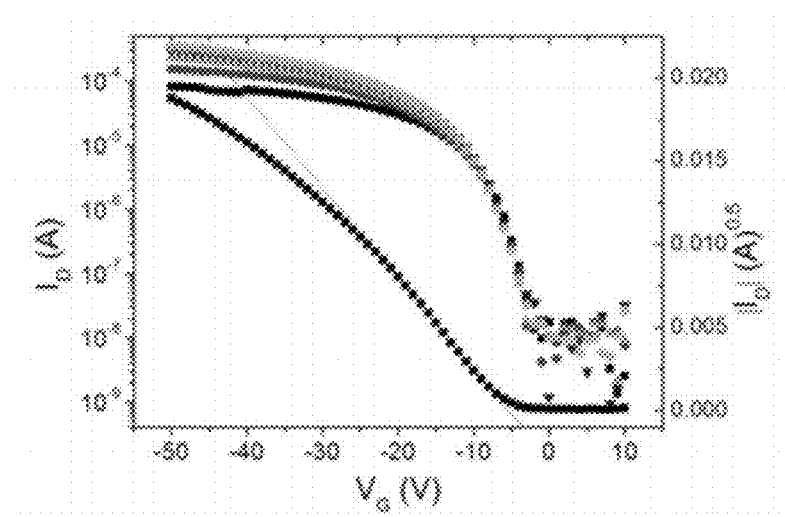
FIG. 7d is transfer curve of the VOPc thin-film transistor epitaxy growth on 2.5 nm BPTT: BPPh inducing layer with a component proportion of (1:2)
Figure 8A:
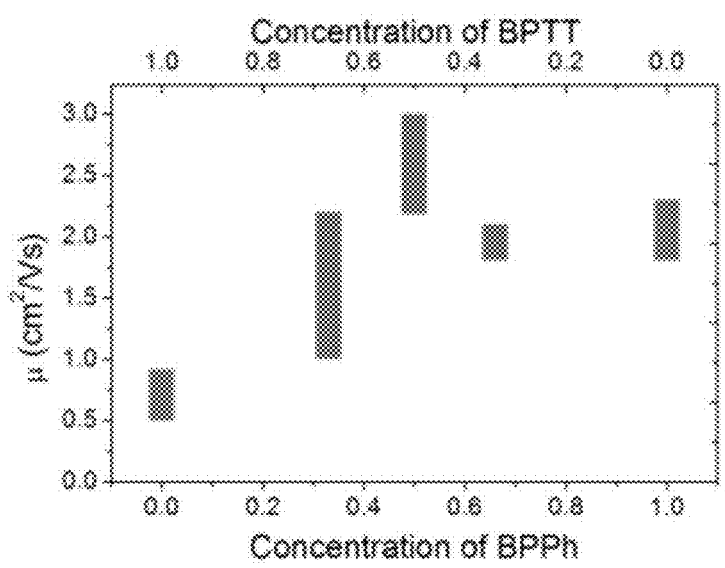
FIG. 8a is a relation between thin film transistor mobility and component proportion of the solid solution inducing layer.
Figure 8B:
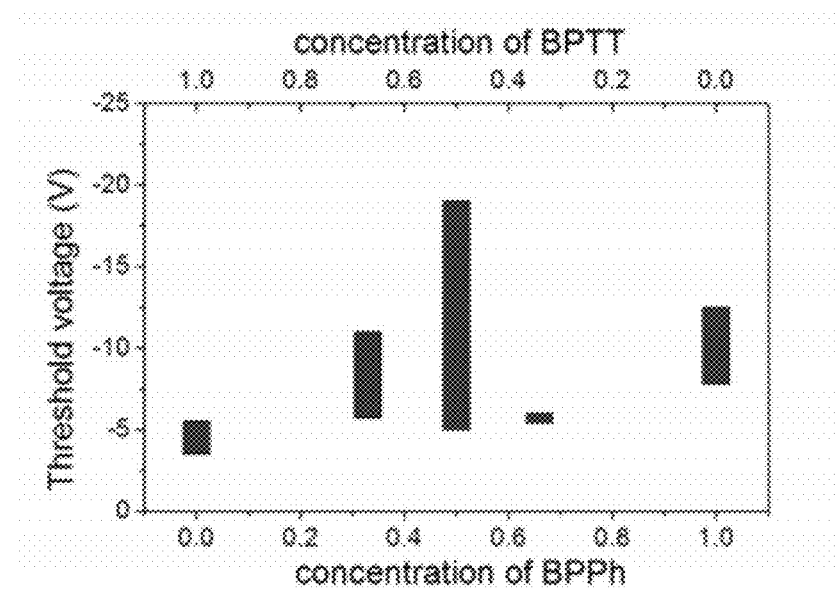
FIG. 8b is a relation between thin film transistor threshold voltage and component proportion of the solid solution inducing layer.

FIG. 6 is AFM topographic image of VOPc thin film epitaxial grown on the inducing layer of BPTT:BPPh solid solution with component proportion of (2:1), (1:1), (1:2). VOPc grows in the way of layer plus island. FIG. 7*a* shows a transistor configuration using the epitaxial VOPc thin films as organic semiconductor layer. FIG. 7*b, c, d* are the corresponding transistor transfer curves, which show the thin film presents high mobility. FIG. 8*a* shows the relationship between the transistor mobility and component proportion of solid solution inducing layer, the thin film mobility acquires maximum value at the ratio of nearly (1:1). FIG. 8*b* is relationship between threshold voltage and component proportion.

Example 2

The experiment method is the same as EXAMPLE 1, and the inducing layer material are P4T, F2-P4T.

Figure 9A:
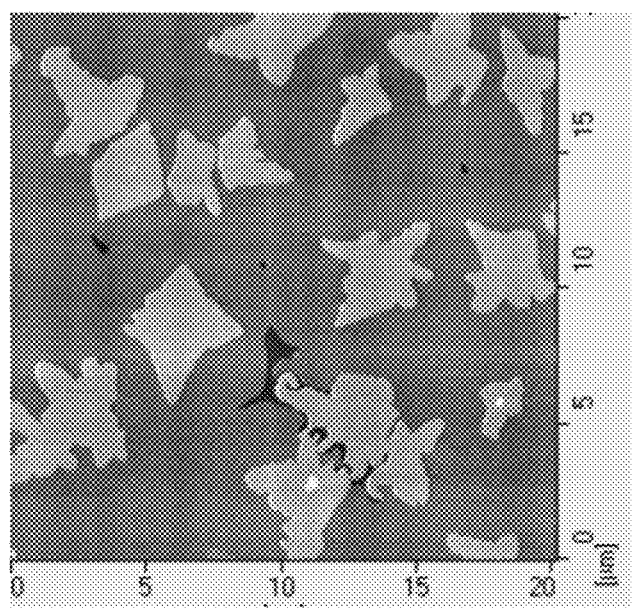
FIG. 9a is an AFM topographic image of 2.5 nm P4T: F2-P4T solid solution inducing layer with a component proportion of (2:1)
Figure 9B:
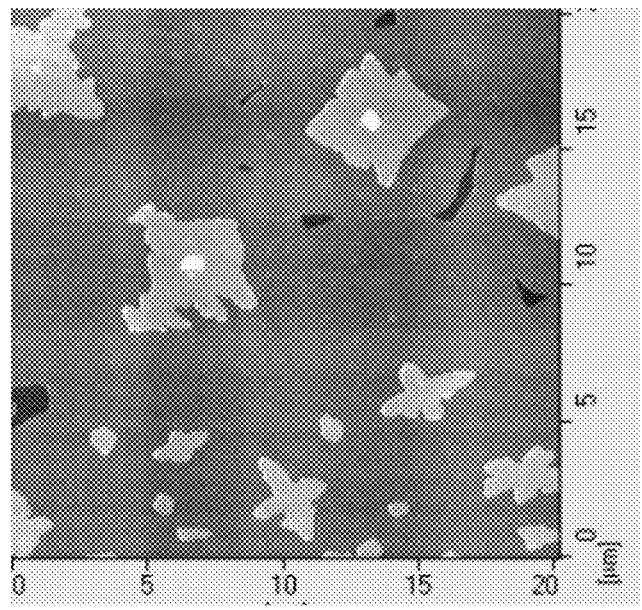
FIG. 9b is an AFM topographic image of 2.5 nm P4T: F2-P4T solid solution inducing layer with a component proportion of (1:1)
Figure 9C:
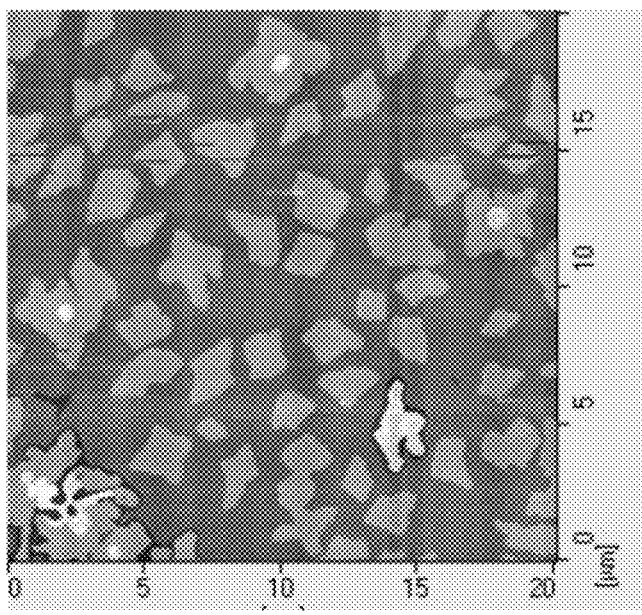
FIG. 9c is AFM topographic image of 2.5 nm P4T: F2-P4T solid solution inducing layer with a component proportion of (1:2)
Figure 10:
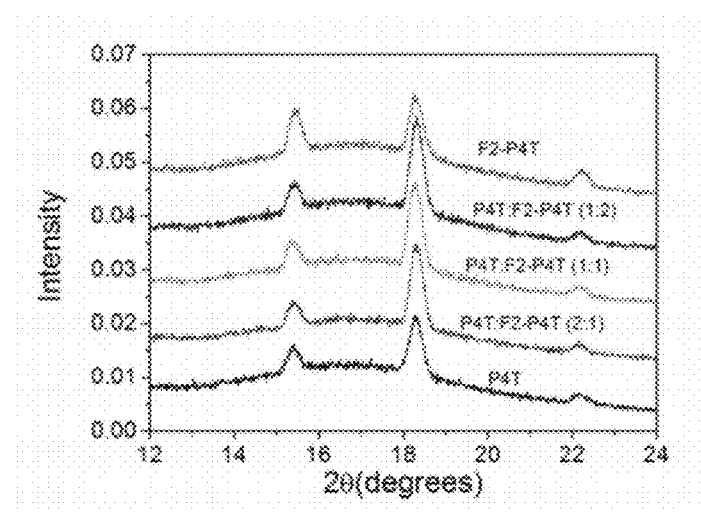
FIG. 10 is in-plane Grazing Incidence X-ray Diffraction patterns of 5 nm P4T: F2-P4T solid solution inducing layer of different proportion.
Figure 11A:
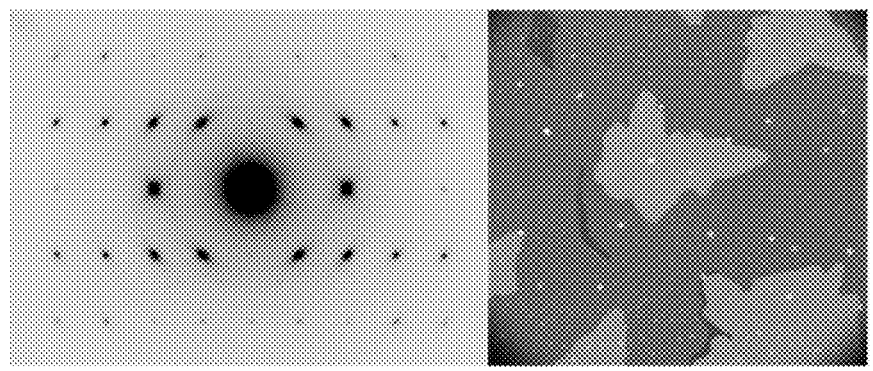
FIG. 11a is the Selected Area Electron Diffraction and its corresponding electron micrograph of 2.5 nm P4T: F2-P4T solid solution inducing layer with a proportion of (2:1)
Figure 11B:
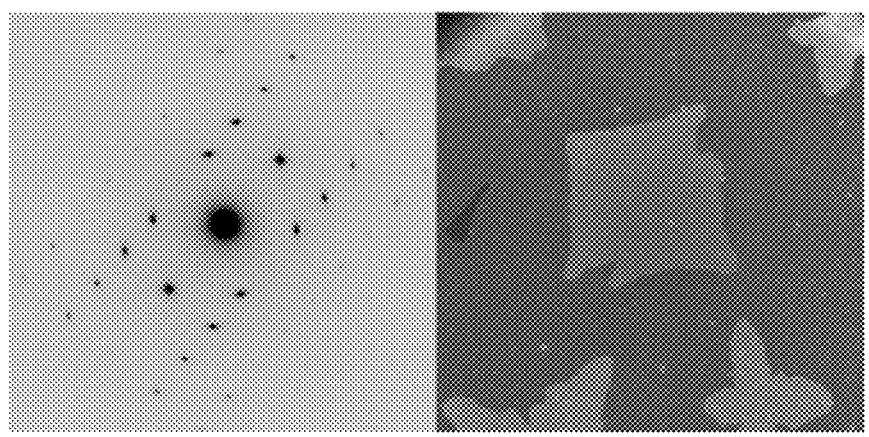
FIG. 11b is the Selected Area Electron Diffraction and its corresponding electron micrograph of 2.5 nm P4T: F2-P4T solid solution inducing layer with a proportion of (1:1)
Figure 11C:
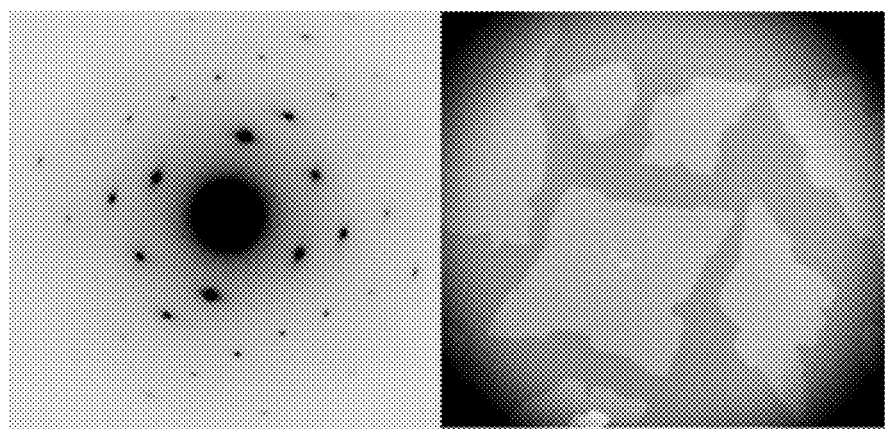
FIG. 11c is the Selected Area Electron Diffraction and its corresponding electron micrograph of 2.5 nm P4T: F2-P4T solid solution inducing layer with a proportion of (1:2)

FIG. 9 is AFM topographic image of 2.5 nm P4T: F2-P4T films with different component proportion. Thin film exhibit layer by layer growth mode, adjacent domains show a good coalescence, forming large grain-sized and smooth thin film. It is suitable for epitaxy growth as inducing layer. FIG. 10 is in-plane XRD diffraction patterns of aforesaid co-deposition thin film. Thin film of all the component proportion shows almost the same lattice spacing. It is because the unit cell parameters of P4T and F2-P4T are very approximate. FIG. 11 shows the selected area electron diffraction patterns of the co-deposition thin films with component proportion respectively being (2:1), (1:1), (1:2), and each single domain of the thin films shows single-crystal-like diffraction pattern.

Figure 12A:
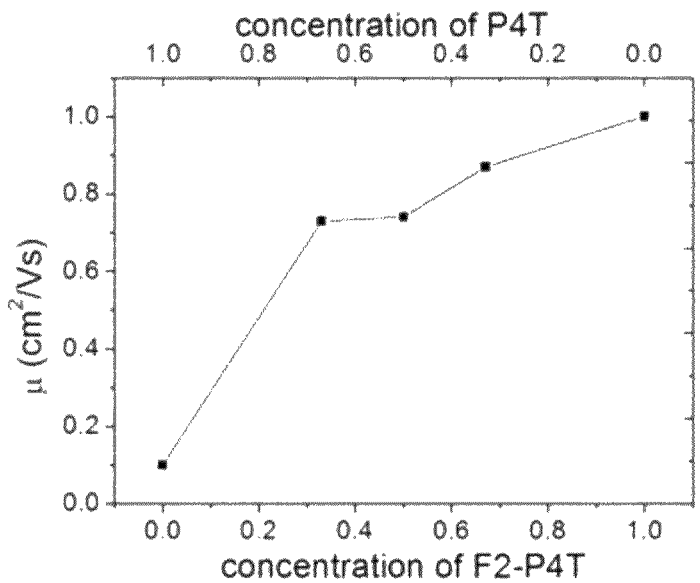
FIG. 12a is a relation between transistor mobility and component proportion of the P4T:F2-P4T solid solution inducing layer.
Figure 12B:
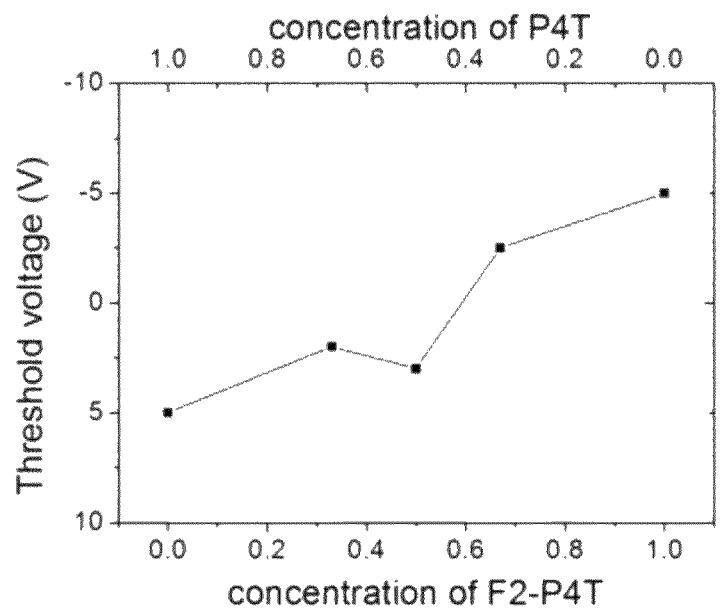
FIG. 12b is a relation between threshold voltage and component proportion of the P4T:F2-P4T solid solution inducing layer.

FIG. 12*a* is a diagram of the relation between the transistor mobility of VOPc thin-film and the component proportion of the inducing layer. Its mobility linearly increases with the inducing layer component proportion. FIG. 11 shows the change of threshold voltage with the proportion, similarly, it shows a trend that it varies with the component proportion of inducing layer linearly.

Example 3

The experiment method is the same as EXAMPLE 1, and the inducing layer materials are F2-BP3T, F4-BP3T.

Figure 13:
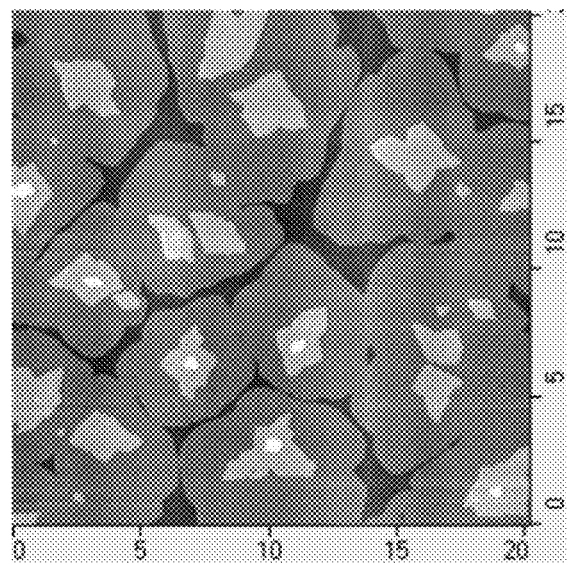
FIG. 13 is an AFM topographic image of 2.5 nm F2-BP3T: F4-BP3T solid solution inducing layer with a component proportion of (11)

FIG. 13 is an AFM topographic image of 2.5 nm co-deposition F2-BP3T: F4-BP3T thin film (component ratio is 1:1).

Figure 14:
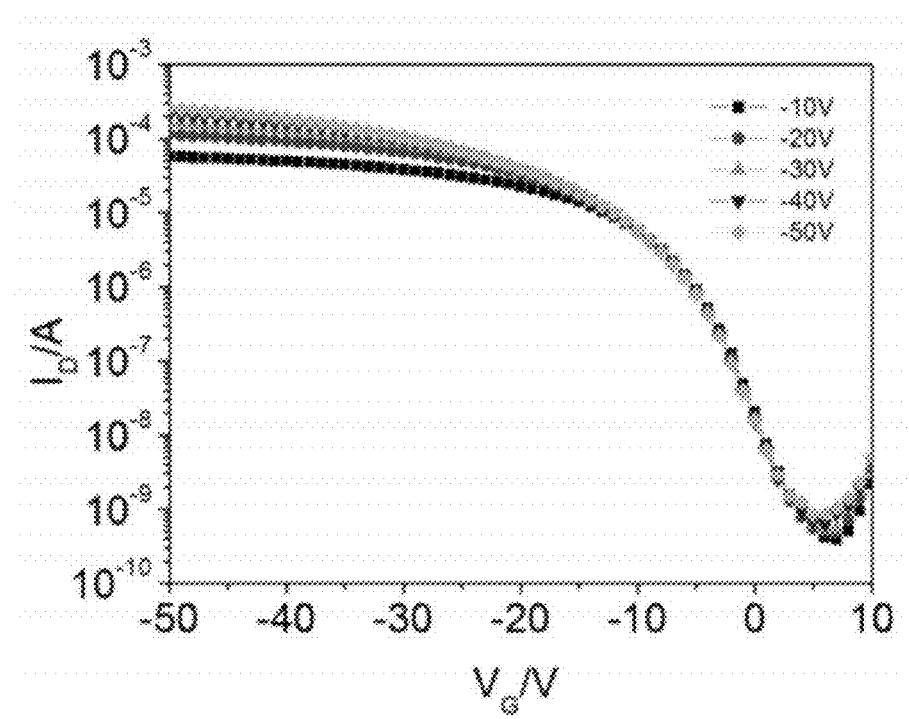
FIG. 14 is transfer characteristic of VOPc thin film transistor using 2.5 nm F2-BP3T:F4-BP3T solid solution of proportion of (1:1) as the inducing layer.

FIG. 14 shows the device performance of the transistor based on VOPc thin film epitaxial grown on aforesaid thin film.

Table 1 shows solid solution inducing layer thin film co-deposited from different materials and the transisitor performance based on non-planar phthalocyanine thin film epitaxial grown on the corresponding solid solution inducing layer.

|  | Semiconductor molecules | mobility (cm2/Vs) | threshold voltage (V) |
|---|---|---|---|
| BPPh:BP2T | VOPc | 0.8~2.5 | −2~−15 |
|  | TiOPc | 0.2~1.0 | −5~−30 |
|  | PbPc | 0.1~0.5 | −2~−20 |
| BPPh:p6P | VOPc | 1.0~3.5 | −3~−15 |
|  | TiOPc | 0.2~1.0 | −5~−30 |
| BPPh:BPTBT | VOPc | 1.0~3.5 | −2~−15 |
|  | TiOPc | 0.2~1.0 | −2~−30 |
|  | SnPc | 0.1~0.5 | −5~−20 |
| BPPh:BPBTB | TiOPc | 0.2~1.0 | −3~−25 |
|  | PbPc | 0.1~0.5 | −2~−15 |
| BPPh:BPTT | VOPc | 0.9~3.5 | −5~−19 |
|  | TiOPc | 0.1~1.0 | −2~−30 |
| BPPh:BP3T | VOPc | 0.5~2.0 | −1~−15 |
|  | SnCl$_2$Pc | 0.1~0.4 | 2~20 |
| BPPh:BP4T | VOPc | 0.8~2.0 | −1~−15 |
|  | TiOPc | 0.1~1.0 | −2~−30 |
| BPPh:3PTT | VOPc | 1.0~3.0 | −2~−15 |
|  | PbPc | 0.1~0.5 | −2~−15 |
| BPTT:p6P | VOPc | 0.9~3.5 | −2~−15 |
|  | SnOPc | 0.1~0.8 | 2~20 |
| BPTT:BPTBT | VOPc | 0.9~2.5 | −2~−10 |
|  | TiOPc | 0.1~1.0 | −2~−30 |
| BPTT:BPBTB | VOPc | 0.9~2.0 | −2~−10 |
|  | SnOPc | 0.1~0.8 | 2~20 |
| BPTT:BP3T | VOPc | 0.5~1.5 | −2~−15 |
|  | TiOPc | 0.1~1.0 | −2~−20 |
| BPTT:BP4T | VOPc | 0.5~1.5 | −2~−15 |
|  | PbPc | 0.1~0.5 | −5~−15 |

| Semiconductor molecules | | mobility (cm2/Vs) | threshold voltage (V) |
|---|---|---|---|
| BPTT:3PT | TiOPc | 0.1~1.0 | -2~-20 |
|  | VOPc | 0.9~2.0 | -2~-15 |
| BPTT:3PTT | VOPc | 0.8~2.0 | -2~-20 |
|  | PbPc | 0.1~0.5 | -5~-15 |
| BPTBT:BPBTB | VOPc | 0.8~2.0 | -2~-15 |
|  | TiOPc | 0.1~1.0 | -2~-20 |
| BPTBT:3PTT | VOPc | 0.8~2.5 | -2~-20 |
|  | SnOPc | 0.1~0.8 | 2~20 |
| BPTBT:BP2T | VOPc | 0.5~2.0 | -2~-15 |
|  | PbPc | 0.1~0.5 | -5~-15 |
| BPTBT:3PT | VOPc | 0.9~2.0 | -2~-15 |
|  | TiOPc | 0.1~1.0 | -2~-30 |
| BP3T:BP4T | PbPc | 0.1~0.5 | -2~-15 |
|  | SnOPc | 0.1~0.8 | 2~20 |
| BP3T:BPTBT | VOPc | 0.4~2.0 | -2~-15 |
|  | TiOPc | 0.1~1.0 | -2~-30 |
| BP3T:3PT | VOPc | 0.5~2.0 | -2~-15 |
| BP3T:3P2T | TiOPc | 0.1~1.0 | -2~-30 |
|  | VOPc | 0.5~2.0 | -2~-15 |
| BP4T:3P2T | VOPc | 0.5~2.0 | -2~-15 |
|  | TiOPc | 0.1~1.0 | -5~-20 |
| BP4T:p8P | VOPc | 0.5~2.0 | -2~-15 |
|  | TiOPc | 0.1~1.0 | -5~-30 |
| BP4T:3PTT | VOPc | 0.5~2.0 | -2~-15 |
|  | PbPc | 0.1~0.5 | -2~-20 |
| BPPh:F2-BPPh | VOPc | 1.5~3.0 | -2~-10 |
|  | TiOPc | 0.1~1.0 | -5~-20 |
|  | SnOPc | 0.1~0.8 | 2~20 |
| BPPh:F4-BPPh | VOPc | 1.0~3.0 | -2~-10 |
|  | TiOPc | 0.1~1.0 | -3~-20 |
|  | PbPc | 0.1~0.5 | -2~-20 |
| BPPh:F2-BPTT | VOPc | 1.0~3.0 | -2~-10 |
|  | TiOPc | 0.1~1.0 | -3~-15 |
| BPPh:F2-BPTBT | VOPc | 1.0~3.0 | -2~-10 |
|  | PbPc | 0.1~0.5 | -2~-20 |
| BPTT:F2-BPTT | VOPc | 0.9~2.0 | -2~-15 |
|  | TiOPc | 0.1~1.0 | -3~-25 |
| BPTT:F4-BPTT | VOPc | 0.9~1.5 | -2~-20 |
|  | TiOPc | 0.1~1.0 | -3~-25 |
| BPTT:F2-BPPh | VOPc | 0.9~3.0 | -2~-15 |
|  | TiOPc | 0.1~1.0 | -3~-25 |
|  | PbPc | 0.1~0.5 | -2~-20 |
| BP2T:F2-BP2T | VOPc | 0.9~3.0 | -2~-10 |
|  | TiOPc | 0.1~1.0 | -3~-25 |
| BP3T:F2-BP3T | VOPc | 0.9~3.0 | -3~-15 |
|  | SnOPc | 0.1~0.8 | 2~20 |
| BP3T:F4-BP3T | VOPc | 0.9~2.0 | -3~-15 |
|  | SnOPc | 0.1~0.8 | 2~20 |
| BP4T:F2-BP4T | VOPc | 0.9~3.0 | -3~-15 |
|  | SnCl2Pc | 0.1~0.4 | 2~20 |
| BP4T:F4-BP4T | VOPc | 0.9~2.0 | -3~-15 |
|  | SnOPc | 0.1~0.4 | 2~20 |
| BPTBT:F2-BPTBT | VOPc | 0.5~2.0 | -5~-25 |
|  | SnCl2Pc | 0.1~0.4 | 5~20 |
| BPTBT:F4-BPTBT | VOPc | 0.5~2.0 | -5~-25 |
|  | SnOPc | 0.1~0.8 | 2~-20 |
| p8P:F2-p8P | PbPc | 0.1~0.5 | -2~-20 |
|  | SnOPc | 0.1~0.8 | 2~20 |
| p8P:F4-p8P | VOPc | 1.5~2.5 | -5~-15 |
|  | SnCl2Pc | 0.1~0.4 | 5~15 |
| 3PT:F2-3PT | VOPc | 1.5~2.5 | -5~-15 |
|  | SnCl2Pc | 0.1~0.4 | 5~20 |
| 3PT:F4-3PT | VOPc | 1.5~2.5 | -5~-15 |
|  | SnOPc | 0.1~0.8 | 2~20 |
| 3P2T:F2-3P2T | VOPc | 1.5~2.5 | -5~-15 |
|  | TiOPc | 0.1~1.0 | -5~-25 |
| 3PTT:F2-3PTT | VOPc | 1.5~2.5 | -5~-15 |
| P4T:F2-P4T | VOPc | 0.1~1.5 | -5~-4V |
|  | SnOPc | 0.1~0.8 | 2~15 |
| P4T:F4-P4T | VOPc | 0.1~1.5 | -10~-4V |
|  | SnOPc | 0.1~0.8 | 2~15 |
| F2-BPPh:F4-BPPh | VOPc | 1.5~3.0 | -2~-10 |
|  | SnOPc | 0.1~0.8 | 2~15 |
| F2-BPPh:F2-BPTT | VOPc | 1.5~3.0 | -1~-10 |
|  | SnCl2Pc | 0.1~0.4 | 5~20 |
| F2-BPPh:F2-BPTBT | VOPc | 1.5~3.0 | -1~-10 |
|  | SnOPc | 0.1~0.8 | 2~15 |
| F2-BPBTB:F4-BPBTB | VOPc | 1.5~3.0 | -1~-10 |
|  | SnCl2Pc | 0.1~0.4 | 5~20 |
| F2-BPTT:F4-BPPh | VOPc | 1.0~2.5 | -1~-10 |
|  | TiOPc | 0.1~1.0 | -5~-25 |
| F2-BP2T:F4-BP2T | VOPc | 1.0~2.5 | -1~-10 |
|  | TiOPc | 0.1~1.0 | -5~-25 |
| F2-BP3T:F2-BP4T | VOPc | 1.0~3.0 | -1~-10 |
|  | TiOPc | 0.1~1.0 | -5~-25 |
| F2-BP3T:F4-BP3T | VOPc | 1.0~3.0 | -1~-10 |
|  | SnCl2Pc | 0.1~0.4 | 5~20 |
| F2-3PT:F4-3PT | VOPc | 1.0~2.0 | -1~-10 |
|  | SnOPc | 0.1~0.8 | 2~15 |
| F2-3P2T:F4-3P2T | VOPc | 1.0~2.0 | -1~-10 |
|  | SnOPc | 0.1~0.8 | 2~15 |
| F2-3PTT:F4-3PTT | VOPc | 1.0~2.5 | -1~-10 |

The present invention is not limited to the above-mentioned embodiments. In general, the inducing layer materials for the Weak Epitaxy Growth disclosed in the present invention can be used in other organic semiconductor components to prepare the components in two-dimensional or three-dimensional integrated device. These integrated devices can be applied in integrated circuits, active matrix display, sensors and photovoltaic cells. The electronic components based on the present invention are easy to be manufactured in large scale.

The invention claimed is:

1. A process for the preparation of a non-planar phthalocyanine thin film according to a weak epitaxial growth method, the process characterized in that an inducing layer used in said weak epitaxial growth method is a solid solution inducing layer formed by any two molecules selected from those represented by formula I and II:

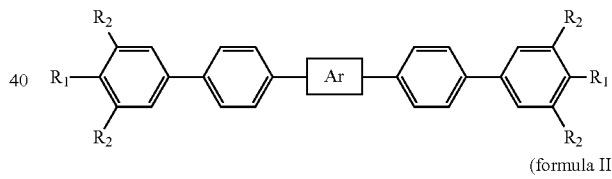
(formula I)

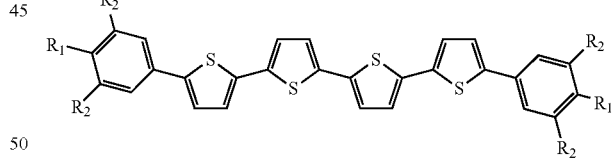
(formula II)

wherein, Ar is a conjugated aromatic group, or one of the following structures:

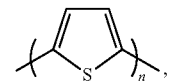

n = 2(5), 3(6), 4(7), $R_1$ and $R_2$ are independently selected from H or F;
wherein the intermolecular forces between said two molecules and the molecules of said non-planar phthalocyanine are van der Waals' forces;
said solid solution inducing layer thin film is well uniformed and the domains show a single-crystal-like structure;

an epitaxy relationship exists between the lattice of said single-crystal-like structure and said non-planar phtalocyanine crystal grown on said solid solution inducing layer.

2. A process according to claim 1, characterized in that the said two molecules forming the said solid solution inducing layer are any two of the following molecules:

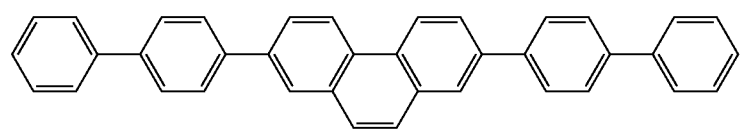
BPPh

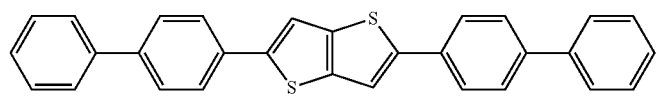
BPTT

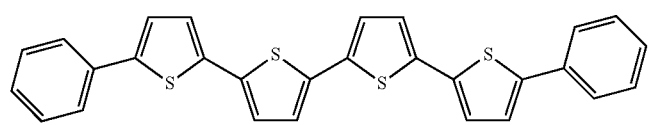
P4T

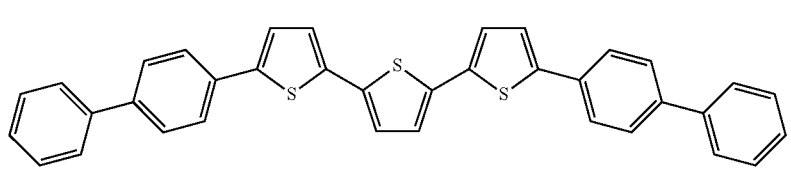
BP3T

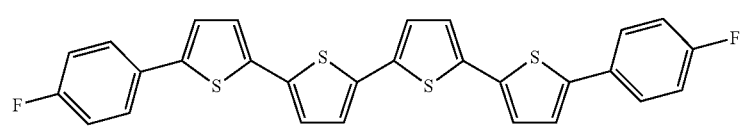
F2-P4T

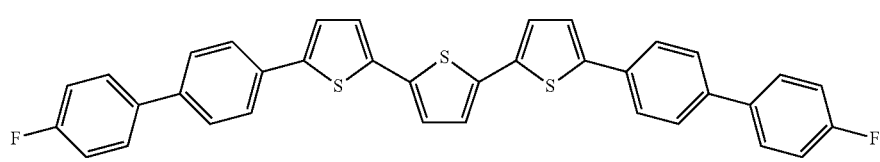
F2-BP3T

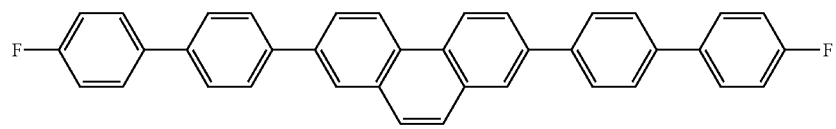
F2-BPPH

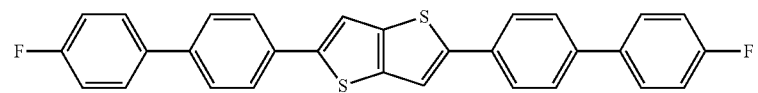
F2-BPTT

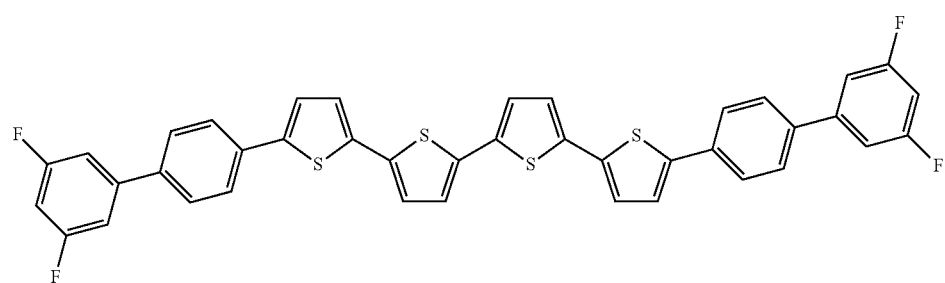
F4-BP4T

-continued

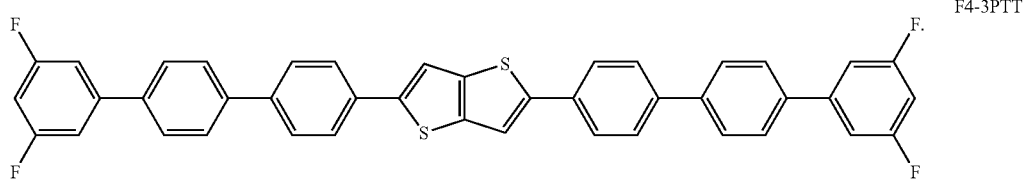

F4-3PTT

3. A process according to claim 1, characterized in that said solid solution inducing layer is formed by depositing said two molecules on the substrate at the same time by vapor deposition, wherein the vacuum degree during deposition is $10^{-4}$ to $10^{-5}$ Pa; the temperature of said substrate is between 150° C. to 240° C.

4. A process according to claim 1, characterized in that the thickness of the said solid solution inducing layer is 1 to 3 molecular layers.

5. A process according to claim 3, characterized in that a silicon nitride layer of 200 to 500 nm is on the surface of said substrate.

6. A non-planar phthalocyanine thin film prepared by the process according to claim 1.

7. An organic thin film transistor, characterized in that said organic thin film transistor comprises the non-planar phthalocyanine thin film according to claim 6, said non-planar phthalocyanine thin film is the semiconductor layer in said transistor.

* * * * *